United States Patent
Loibl et al.

(10) Patent No.: US 8,502,089 B2
(45) Date of Patent: Aug. 6, 2013

(54) METHOD FOR CONTACTING A RIGID PRINTED CIRCUIT BOARD TO A CONTACT PARTNER AND ARRANGEMENT OF A RIGID PRINTED CIRCUIT BOARD AND CONTACT PARTNER

(75) Inventors: Josef Loibl, Bad Abbach (DE); Hermann-Josef Robin, Regensburg (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 393 days.

(21) Appl. No.: 12/809,841

(22) PCT Filed: Dec. 11, 2008

(86) PCT No.: PCT/EP2008/067292
§ 371 (c)(1),
(2), (4) Date: Nov. 5, 2010

(87) PCT Pub. No.: WO2009/080540
PCT Pub. Date: Jul. 2, 2009

(65) Prior Publication Data
US 2011/0036627 A1    Feb. 17, 2011

(30) Foreign Application Priority Data

Dec. 21, 2007   (DE) .......................... 10 2007 062 202

(51) Int. Cl.
*H01L 23/48* (2006.01)
*B23K 31/02* (2006.01)
*B23K 26/20* (2006.01)
*H05K 1/09* (2006.01)

(52) U.S. Cl.
USPC ....... 174/549; 228/164; 219/121.64; 174/257

(58) Field of Classification Search
USPC ............. 174/549, 257; 219/121.64; 228/164
See application file for complete search history.

(56) References Cited

U.S. PATENT DOCUMENTS 3,934,073 A * 1/1976 Ardezzone ................. 174/549
4,091,125 A * 5/1978 Delgadillo .................. 427/98.5
(Continued)

FOREIGN PATENT DOCUMENTS

CA   2286030 A1   11/1998
DE   19618099 A1  11/1997
(Continued)

*Primary Examiner* — Timothy Thompson
*Assistant Examiner* — Charles Pizzuto
(74) *Attorney, Agent, or Firm* — Laurence A. Greenberg; Werner H. Stemer; Ralph E. Locher

(57) ABSTRACT

A method for producing an electrical connection between a rigid printed circuit board and a metallic contact partner, includes preparing the rigid printed circuit board having at least one copper layer and at least one prepreg layer, bringing the metallic contact partner and the printed circuit board together in such a way that the metallic contact partner is brought into contact with a contact pad on the copper layer of the printed circuit board, forming a cutout in the printed circuit board by removing the prepreg layer in at least one partial region of the contact pad, and irradiating with laser light to form a weld connection between the contact partner and the contact pad. A configuration of a rigid printed circuit board, a metallic contact partner and an electrical connection point, as well as a module having such a configuration, are also provided.

10 Claims, 2 Drawing Sheets

(56) References Cited

U.S. PATENT DOCUMENTS

| | | | |
|---|---|---|---|
| 4,424,095 A * | 1/1984 | Frisch et al. | 216/17 |
| 5,040,996 A * | 8/1991 | Kobold et al. | 439/76.2 |
| 5,829,125 A | 11/1998 | Fujimoto et al. | |
| 6,194,683 B1 * | 2/2001 | Cox et al. | 219/121.63 |
| 6,461,527 B1 | 10/2002 | Haupt et al. | |
| 6,533,620 B2 * | 3/2003 | Franzen et al. | 439/876 |
| 7,763,827 B2 * | 7/2010 | Papenfuss et al. | 219/121.64 |
| 7,885,080 B2 | 2/2011 | Janisch et al. | |
| 7,983,054 B2 * | 7/2011 | Eglinger et al. | 361/752 |
| 2002/0001984 A1 | 1/2002 | Franzen et al. | |
| 2003/0114022 A1 | 6/2003 | Franzen et al. | |
| 2004/0095444 A1 * | 5/2004 | Drummond et al. | 347/86 |
| 2006/0065640 A1 * | 3/2006 | Lizotte et al. | 219/121.61 |
| 2006/0207469 A1 * | 9/2006 | Fink et al. | 102/530 |
| 2007/0053640 A1 * | 3/2007 | Goell et al. | 385/123 |
| 2007/0075059 A1 * | 4/2007 | Arai | 219/121.71 |
| 2007/0295606 A1 * | 12/2007 | Chang | 205/125 |
| 2008/0292416 A1 * | 11/2008 | Kado et al. | 408/67 |
| 2009/0034927 A1 * | 2/2009 | Temelkuran et al. | 385/125 |
| 2009/0178273 A1 * | 7/2009 | Lauffer | 29/830 |
| 2009/0299693 A1 * | 12/2009 | Kane et al. | 702/179 |
| 2010/0025091 A1 * | 2/2010 | Ferdinandi et al. | 174/257 |
| 2010/0065299 A1 * | 3/2010 | Liu et al. | 174/102 R |

FOREIGN PATENT DOCUMENTS

| | | |
|---|---|---|
| DE | 19929179 A1 | 1/2001 |
| DE | 102005003448 A1 | 8/2006 |
| EP | 758145 A2 * | 2/1997 |
| EP | 0758145 A2 | 2/1997 |
| EP | 1155602 A1 | 11/2001 |
| EP | 1186370 A2 | 3/2002 |
| EP | 1305988 A1 | 5/2003 |
| JP | 5020269 A | 1/1993 |
| JP | 2001525987 A | 12/2001 |
| JP | 2002538599 A | 11/2002 |

* cited by examiner

METHOD FOR CONTACTING A RIGID PRINTED CIRCUIT BOARD TO A CONTACT PARTNER AND ARRANGEMENT OF A RIGID PRINTED CIRCUIT BOARD AND CONTACT PARTNER

BACKGROUND OF THE INVENTION

Field of the Invention

The invention relates to a method for producing an electrical connection between a rigid printed circuit board (PCB) and a metal contact partner, an arrangement of said elements with an electrical connection point implemented therebetween, and a module for complete installation into an engine or transmission of a motor vehicle and using an electrical connection point of said kind.

In the automotive engineering field components such as transmission, engine and braking systems are increasingly being controlled primarily electronically. In this regard there is a development toward integrated mechatronic controllers, i.e. toward the integration of control electronics and the associated electronic components such as sensors or valves into the transmission, the engine or the braking system. Generally, therefore, control devices have a multiplicity of electronic components which are connected to other components outside the control device. With such "in situ electronics", said controllers are no longer accommodated in a separate protected electronics room and must therefore be able to withstand corresponding environmental influences as well as mechanical, thermal and chemical stress.

For that purpose they are normally installed in special enclosures. The enclosures additionally fulfill an important shielding function. In order to enable a reliable connection to components located outside of the enclosure, an electrical connection is necessary from the interior of the enclosure to the exterior of the enclosure. In current series applications, electrical signals and currents are distributed by means of leadframes or by using flexible printed circuit boards (FPCBs).

The typical layout of flexible printed circuit boards for mechatronic applications consists of a base layer as a composite consisting of polyimide film, acrylic adhesive film and copper film. The copper layer is typically provided with a conductive track pattern by means of an etching process. Said conductive track patterns must have bondable, weldable and/or solderable surfaces in the contacting region. In order to provide the necessary protection against contamination, damage and conductive track short-circuits, a cover layer of polyimide film is laminated onto the patterned copper layer by means of acrylic adhesive film. Said overall composite consisting of base layer, copper layer and cover layer is then laminated onto a base plate. The increased use of flexible printed circuit boards of this design in integrated mechatronics in the interim is a significant cost driver in this case.

It is known to use laser welding methods for implementing an electrically conductive connection between a flexible printed circuit board and a metal conductor. Principal benefits of this technology consist in the fact that no additional parts such as e.g. rivets are required for establishing a connection and that the connections can be produced during manufacture cheaply and with a high degree of design variability.

EP 1 155 602 B1 describes an electrical connection method in which a welded or soldered connection is established between a flexible printed circuit board which is assembled from two insulating layers and at least one metallic conductive track running therebetween, and a metal contact partner a welded or soldered connection is established by means of laser light. In this arrangement a light-radiating opening is embodied into a first insulating layer and a connecting opening is embodied opposite the light-radiating opening in the second insulating layer. A connecting section of the metallic contact partner is then inserted through the connecting opening and brought into contact with the metallic conductive track. At the next stage the conductive track and the connecting section are heated by radiant heat from laser light directed through the light-radiating opening and in this way a welded or soldered connection is produced.

In a development of the aforementioned method, EP 1 305 988 B1 describes a method for contacting a flexible printed circuit board by means of a contact partner wherein the laser light irradiation for establishing the weld structure can be effected directly through the second insulating layer. This removes the overhead of providing a cutout in the second insulating layer or of retrospectively creating a double-sided access at this point on the finished flexible printed circuit board by local removal of the second insulating layer.

A disadvantageous aspect of said methods, however, is that they are complicated and labor-intensive and above all that they exclusively allow the electrical connection of cost-intensive flexible printed circuit boards to metallic contact partners.

It is known to use rigid printed circuit boards (PCBs) as signal and current distribution components. If it is intended, for example, to establish an electronic connection between two PCBs, this is typically realized in the prior art by means of a separate connector, called a press-fit interconnector, which has at least one press-fit pin or one press-fit pin region on two sides. It is disadvantageous that a connector of this type has to be designed and produced individually. Furthermore the step of installing and connecting the connector to the printed circuit boards is an additional process which must satisfy corresponding quality requirements and is expensive and time-consuming.

Because of the growing demand the search is intensifying for further alternatives for reducing the costs of establishing electrical connections of printed circuit boards to different possible contact partners.

BRIEF SUMMARY OF THE INVENTION

The object underlying the invention is to disclose a method for establishing an electrical connection between a rigid printed circuit board (PCB) and a metallic contact partner which is easy and cost-effective to perform and at the same time realizes a mechanically stable and electrically reliable connection.

In particular it is intended that the connecting point created by means of the method should also be suitable for contacting electrical components under more difficult environmental conditions, such as exist for example in a transmission or an engine of a motor vehicle.

According to the invention a method for establishing an electrical connection between a rigid printed circuit board and a metallic contact partner is proposed which comprises the following steps of:
  providing the rigid printed circuit board at least comprising
    a copper layer and at least one prepreg layer
  bringing the metallic contact partner and the printed circuit
    board close to each other in such a way that the metallic
    contact partner is brought into contact with a contact pad
    on the copper layer of the printed circuit board;

embodying a cutout in the printed circuit board by removal of the prepreg layer in at least one subregion under the contact pad and irradiating with laser light, a welded joint being embodied between the contact partner and the contact pad.

Accordingly, a rigid printed circuit board is understood according to the invention to mean a printed circuit board (PCB) having at least one single-layer structure consisting of a copper layer and a prepreg layer connected thereto. Said prepreg layer is also referred to as a prepreg core. Prepreg (preimpregnated fiber) is a composite consisting of epoxy resin and fiber glass matting, also known under the material identification code FR4. Depending on application, more temperature-resistant material combinations, a so-called FR5 material for example, can also be used as the prepreg core. According to the invention a further layer for providing electrical insulation, a solder resist for example, can be applied to the copper layers.

The contact pad on the copper layer remains exposed from a possible insulating layer, a solder resist for example, as a contact point or is exposed from the insulating layer before the contact partner is mounted.

According to the invention, in particular wires, pins and wire strands, leadframes or other flexible or rigid printed circuit boards can be used as contact partners. The contact pad is the contact point on the conductive track layer on which a contact partner is brought to bear and subsequently is mechanically and electrically connected thereto by means of the laser welding.

When the laser light strikes the conductive track implemented as a copper layer, an absorption of energy occurs. In the process the energy introduced during the welding leads to a practically abrupt melting of the conductive track in the region of the contact pad and to a penetration of the laser beam into the contact region of the contact partner and to the embodiment of a welded joint.

Advantageously there is thus provided according to the invention a method which is easy to perform and in particular represents a more affordable alternative to the previously known applications using flexible printed circuit boards. In addition, as a result of using laser welding, qualitatively high-grade electrical connections which also fulfill high mechanical requirements can be produced reproducibly with high process reliability. Moreover, all the advantages of laser technology can be used. For example, additional parts, such as rivets, or additional materials, such as solder, are not required for a permanent laser welded joint. Furthermore, the type of connection permits high degrees of freedom with regard to the mechanical design and guarantees minimum contact resistances.

In another advantageous embodiment of the method, the rigid printed circuit board comprises at least two copper layers and at least one prepreg layer running therebetween. According to said inventively preferred variant, at least two conductive track layers, i.e. the copper layers, are available. Compared to a design having only one copper layer this advantageously enables in particular a better unbundling in the layout, a higher number of conductive tracks and/or a use of wider conductive tracks in order to increase the current-carrying capability to be provided.

The depth of penetration of the laser beam into the contact partner plays an important role in terms of the quality of the connection formed during the welding operation. If the laser beam is unable to penetrate into the contact partner, i.e. if only the conductive track (copper layer) is melted, no satisfactory welding result will be achieved. If, on the other hand, the laser beam penetrates into the contact partner, an effect referred to as the deep-weld effect occurs. This consists in the contact partner material being abruptly melted, with a more or less eruptive behavior of the molten metal being observed. The eruptive behavior leads to molten contact partner material being sprayed away, a depression being formed in the central region of the contact partner due to the material loss. As a result of the depression being formed a ring-shaped welding region is obtained which is undesirable because depending on the size of the annular opening a part of the available weld contact area remains unused.

In order to achieve a deep-weld effect optimizing the quality of the welded joint, the laser is preferably operated in such a way that the melt depth of the contact partner surface amounts to between 0.5 and 1 mm.

The characteristics of the deep-weld effect are influenced by a multiplicity of parameters, in particular welding energy, pulse power, welding time and weld spot diameter. Advantageous value ranges when using an Nd:YAG laser having a wavelength of 1.06 μm and an average output power of 30-500 W which lead to welded joints having good mechanical and electrical strength are: a welding energy of 7 to 11 J, a pulse power of 1 to 3 KW, a welding time of 3 to 10 ms, and a weld spot diameter of 0.3 to 0.6 mm. By this means welded joints having good mechanical strength and low electrical contact resistance can be produced.

According to the invention it is also possible to set a plurality of weld spots in order to protect and strengthen the welded joint. In addition the current-carrying capability can advantageously be improved at the same time.

A further advantageous method-related measure is characterized in that a plurality of positionally offset laser light pulses are used in order to build up the welded joint. By means of the position offset an effective enlargement of the welding region is achieved, thereby leading to an increase in the strength of the joint.

In order to produce a permanent welded joint, the rigid printed circuit board and the respective contact partner must be in gapless contact with one another during the welding operation. In the case of methods using flexible printed circuit boards this must be ensured by means of a spring-loaded auxiliary device which presses the FPCB firmly against the contact partner during the welding. This is not absolutely essential when a rigid printed circuit board is used. In a preferred embodiment of the method according to the invention, a contacting strap can additionally be embodied in the rigid printed circuit board for this purpose. In this case the rigid printed circuit board is embodied in the welding regions in such a way that a strap can be incorporated into the printed circuit board as a pretensioned spring. In one implementation said strap can be created for example by a rectangular area being cut or milled into the printed circuit board around the contact pad on three sides. By means of this constructionally simple measure the rigid printed circuit board already includes a spring-loaded hold-down function and an additional hold-down device is no longer absolutely necessary. Other geometric embodiments of the contacting strap are encompassed according to the invention.

If wires or leadframes are used as contact partners, in an advantageous development of the method these can be stamped in the welding region. During the stamping a so-called contact is produced on the contact partner, by means of which a reliable and secure bearing against the contact pad can be created on the printed circuit board. When stranded wires are used, these can be compacted at the ends in order to improve their weldability.

In another preferred embodiment variant of the method the rigid printed circuit board can be embodied as thin. This means that the copper layers of the rigid printed circuit board have a thickness in the range from 35 μm to 70 μm and the prepreg layer a thickness in the range from 150 μm to 350 μm. A plastic deformability of the rigid printed circuit board can be achieved as a result of the thin embodiment. The plastic deformability is particularly good if the conductive tracks in the copper layer are produced by means of thin division lines, in other words as great a copper surface as possible remains on the printed circuit board. By bending the printed circuit board this advantageously enables three-dimensional areas and structures to be embodied and the design variability to be increased.

In order to create the cutout in the rigid printed circuit board the prepreg layer can be removed mechanically, for example by drilling, milling or die-cutting. An equally preferred embodiment of the method provides that the prepreg layer be removed by irradiation by means of laser light. Advantageously the embodiment of the cutout can also be accomplished together with the removal of the prepreg layer and the subsequent welding by means of laser light irradiation in one method step.

The quality of the welding can additionally be affected by the influencing factors angle of incidence of the laser beam, focal position, focal spot diameter (energy density) and degree of oxidation of the Cu conductive track. Further influencing factors are the diameter of the contact partner as well as the use of a contact partner that is silver-plated on the contact side and the thickness of said silver layer. The aforesaid parameters and influencing factors can mutually affect one another at least partially, i.e. they have to be optimized as a function of one another in relation to the minimizing of the deep-weld effect.

Given an ideal choice of the parameters, welding points having a full-coverage, substantially circular disk-shaped connection zone are created.

In another embodiment according to the invention, a further improvement in the strength of the weld structure obtained can be achieved through the use of laser light double pulses that are directed onto different points within the contour of the contact pad.

The invention also relates to an arrangement consisting of a rigid printed circuit board, a metallic contact partner and an electrical connecting point between the rigid printed circuit board and the metallic contact partner, wherein the rigid printed circuit board is built from at least one copper layer and a prepreg layer. In this arrangement there is embodied on the copper layer at least one contact pad on which the metallic contact partner is brought to bear. According to the invention a welding region produced by means of the laser light irradiation is also located between the aforesaid elements.

In a further preferred inventive arrangement consisting of a rigid printed circuit board, a metallic contact partner and an electrical connecting point between the rigid printed circuit board and the metallic contact partner, the rigid printed circuit board comprises at least one first and one second copper layer and at least one prepreg layer running therebetween. In particular an improved separation in the layout can be achieved through the provision of at least one second conductive track layer.

An important technical application of the method according to the invention and arrangement according to the invention having an electrical connecting point consists in the contacting of electrical wiring elements or in the direct contacting of electrical components such as, for example, connectors, sensors, valves and/or actuators which are accommodated together with a control device in an engine or transmission of a motor vehicle. For this purpose the method according to the invention and the arrangement according to the invention create a suitable, economical, particularly compared with the use of flexible printed circuit boards, means of electrical contacting between the aforesaid elements, the created welded joint being particularly resistant such that it is capable of withstanding the ambient conditions prevailing in a transmission or engine (temperature range from approx. −40° C. to 150° C., vibrations up to approx. 40 g). Furthermore, the type of connection according to the invention permits high degrees of freedom in relation to the mechanical design and guarantees minimum contact resistances.

In addition the present invention relates to an assembly designed to be fully installed into an engine or a transmission of a motor vehicle, into which assembly the above-described advantageous arrangement according to the invention is integrated. Said assembly can have the following elements:
  a control device which has an oil-tight housing in which an electronic circuit is accommodated,
  a rigid printed circuit board which is electrically connected to the electronic circuit and is brought out externally through a packed sealing gap of the housing, and
  electrical terminals provided outside of the control device which according to the inventive arrangement are connected as contact partners to the rigid printed circuit board.

DESCRIPTION OF THE INVENTION

Figure 1:
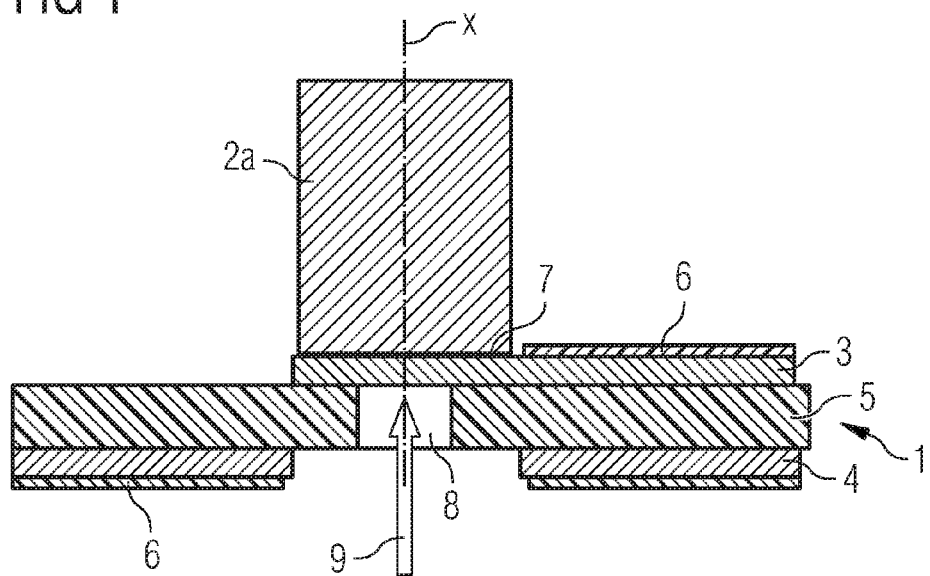
FIG. 1 shows a schematic sectional view of a rigid printed circuit board and a metallic contact partner at a time during the creation of the welded joint according to the invention.

FIG. 1 shows a schematic sectional view of a rigid printed circuit board 1 and a pin 2a as metallic contact partner 2 at a time during the creation of the welded joint according to the invention. The rigid printed circuit board 1 comprises a first copper layer 3 and a second copper layer 4 between which is embedded a prepreg layer 5. The first copper layer 3 is referred to in the following also as the upper copper layer 3. A solder resist layer 6 is applied in each case to the upper copper layer 3 and the lower, second copper layer 4 in order to provide an electrical insulation. The upper copper layer 3 is exposed from the solder resist layer 6 in the region of the contact pad 7. The pin 2a is brought into contact with its front face on the contact pad 7. Before the welding step is performed, therefore, the rigid printed circuit board 1 and the contact partner 2 are brought closer to each in such a way that a surface of the contact partner 2 bears on the copper layer 3 over its entire area. A cutout 8 is embodied in the printed circuit board 1 underneath the contact pad 7. The welded joint is produced from below, i.e. from the side of the copper layer 3 opposite the pin 2a, through said cutout 8 by means of a laser beam 9. Preferably an incidence of light perpendicular to the copper layer conductive track plane 3 is chosen. The laser beam can strike the adjacent front face of the pin 2a in the region of the central longitudinal axis x. Alternatively to the illustrated direct contacting of the printed circuit board 1 with a pin 2a, the printed circuit board 1 can also be connected in an analogous manner to the ends of electrical wiring elements running in the transmission or engine, for example leadframes or other contact partners.

Figure 2:
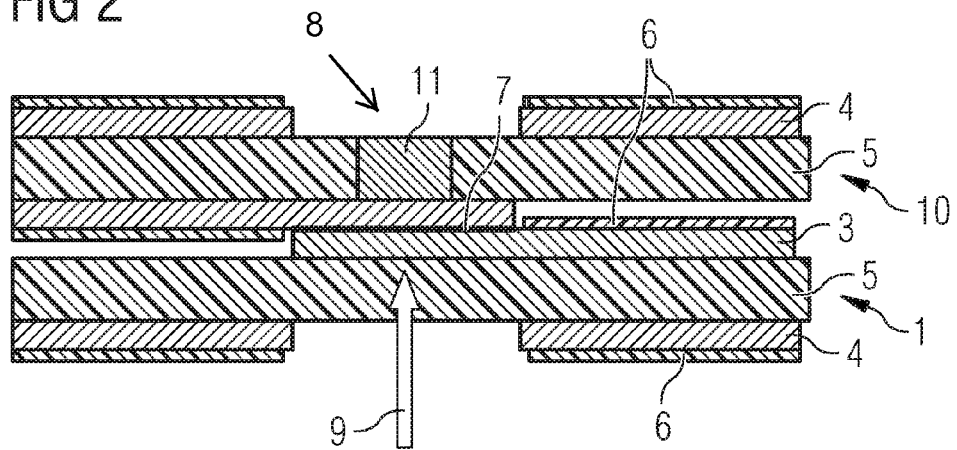
FIG. 2 shows a schematic sectional view of a rigid printed circuit board at the time of the creation of the welded joint according to the invention to a second rigid printed circuit board.

FIG. 2 shows a sectional view of a rigid printed circuit board 1 at the time of the creation of the laser weld joint according to the invention to a second rigid printed circuit board 10. The printed circuit boards 1, 10 can be of identical or different design. Mechanically, the bond to the second printed circuit board 10 can be produced for example by means of lamination or adhesive sealing. The first and second printed circuit board 1, 10 are laid with their contact pads 7 one on top of the other and welded by means of a laser beam 9. A copper inlay 11 can additionally be inserted in the contacting region 7 into a cutout 8 of the printed circuit board 10. This can advantageously be used if the strength of the copper layers 3, 4 in the welding region should not be sufficient for a reliable welded joint. The inventive joining of two or more printed circuit boards 1, 10 advantageously permits the building of complex structures.

Figure 3:
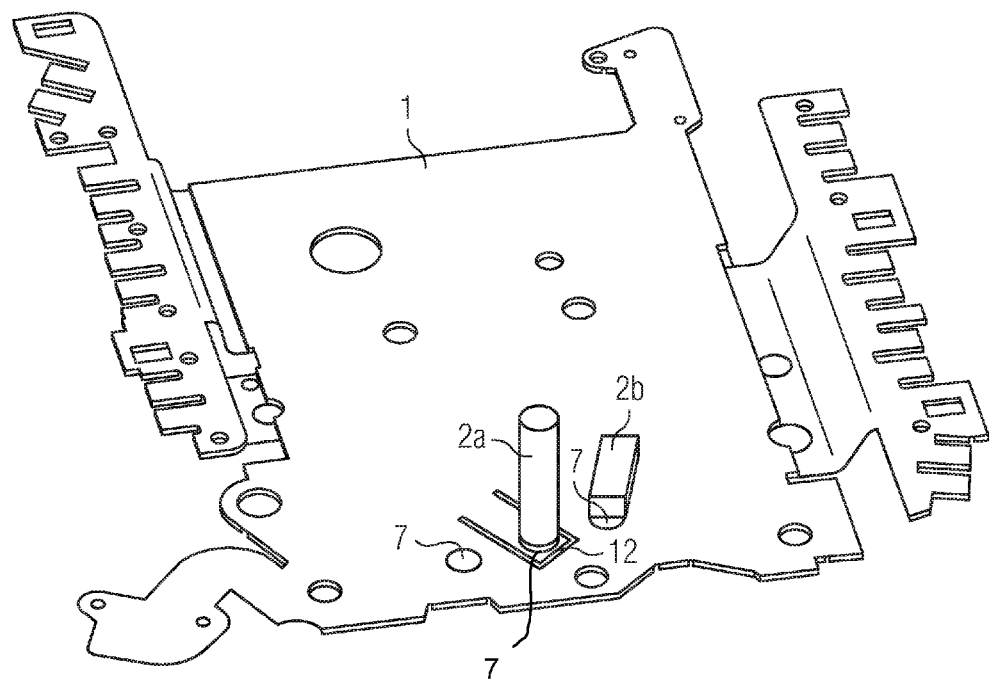
FIG. 3 shows a perspective plan view onto a rigid printed circuit board connected to metallic contact partners and having an embodied contacting strap.

FIG. 3 shows in a perspective plan view the connection between a rigid printed circuit board 1 for potential and signal distribution to a pin 2a and a leadframe 2b as contact partners 2. Contact pads 7 which can be embodied as circular are provided on the printed circuit board 1. A rectangularly embodied contacting strap 12 can be embodied in the printed circuit board 1 around the pin 2a and the contact pad 7 associated therewith. Said contacting strap 12 can act as a pretensioned spring and as a result advantageously assume a hold-down function. In this way the printed circuit board 1 is pressed with the contact pad 7 firmly against the contact partner 2, in the present case, therefore, against the adjacent front face of the pin 2a. According to the invention the contact pads 7 and the contacting strap 12 can also be implemented in other geometric embodiments.

To sum up it may be said that significant cost savings are made possible according to the invention through the use of a low-cost rigid printed circuit board and by employing the cost-effective direct assembly process by means of laser welding, particularly in a series production context. In particular, all connections to the different possible contact partners can advantageously be realized by means of the same method.

The invention claimed is:

1. A method for establishing an electrical connection between a rigid printed circuit board and a metallic contact partner, the method comprising the following steps of:

providing the rigid printed circuit board with at least a prepreg layer and a copper layer having a contact pad on the copper layer;

bringing the metallic contact partner and the printed circuit board close to each other with the metallic contact partner in contact with the contact pad on the copper layer of the printed circuit board;

forming a cutout in the printed circuit board by removing the prepreg layer in at least a subregion underneath the contact pad;

forming a welded joint between the contact partner and the contact pad by irradiating with laser light; and providing a contacting strap forming a pretensioned spring in the rigid printed circuit board.

2. The method according to claim 1, which further comprises providing the rigid printed circuit board with at least two copper layers and at least one prepreg layer extending therebetween.

3. The method according to claim 2, which further comprises providing the copper layers of the printed circuit board with a thickness of 35 µm to 70 µm and providing the prepreg layer of the printed circuit board with a thickness of 150 µm to 350 µm.

4. The method according to claim 1, which further comprises carrying out the step of removing the prepreg layer by mechanical machining or by irradiation with laser light.

5. The method according to claim 1, which further comprises using an Nd:YAG laser as a laser light source and operating the laser light source at an average output power in a range of from 30 to 500 W.

6. The method according to claim 1, which further comprises forming the welded joint by producing at least one weld spot having a diameter of between 0.3 and 0.6 mm with an optical system located in a beam path of the laser light.

7. The method according to claim 1, which further comprises forming the welded joint by applying a welding energy of 7 to 11 J during a welding time of 3 to 10 ms.

8. The method according to claim 1, which further comprises forming the welded joint by using a pulsed Nd:YAG laser having a pulse power of 1 to 3 kW.

9. The method according to claim 1, which further comprises creating the welded joint with a plurality of laser light pulses.

10. The method according to claim 1, which further comprises creating the welded joint with a plurality of double laser light pulses.

* * * * *